(12) United States Patent
Mason

(10) Patent No.: US 9,090,860 B2
(45) Date of Patent: Jul. 28, 2015

(54) PROCESS FOR CREATING SHAPE-DESIGNED PARTICLES IN A FLUID

(75) Inventor: Thomas G. Mason, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1186 days.

(21) Appl. No.: 12/575,920

(22) Filed: Oct. 8, 2009

(65) Prior Publication Data

US 2010/0087352 A1 Apr. 8, 2010

Related U.S. Application Data

(60) Provisional application No. 61/103,777, filed on Oct. 8, 2008.

(51) Int. Cl.
| | | |
|---|---|---|
| *B81C 1/00* | (2006.01) | |
| *C11D 11/00* | (2006.01) | |
| *G03F 7/09* | (2006.01) | |
| *G03F 7/11* | (2006.01) | |
| *G03F 7/16* | (2006.01) | |
| *G03F 7/40* | (2006.01) | |
| *C25D 5/48* | (2006.01) | |
| *C25D 15/02* | (2006.01) | |

(52) U.S. Cl.
CPC ...... *C11D 11/00* (2013.01); *G03F 7/09* (2013.01); *G03F 7/11* (2013.01); *G03F 7/16* (2013.01); *G03F 7/40* (2013.01); *B81C 2201/0149* (2013.01); *C25D 5/48* (2013.01); *C25D 15/02* (2013.01)

(58) Field of Classification Search
USPC .......... 424/489, 497; 427/100; 428/143, 156, 428/195.1, 325, 403; 429/221; 430/5; 435/174, 459; 436/523; 438/778; 510/136; 521/154
See application file for complete search history.

(56) References Cited

U.S. PATENT DOCUMENTS

| | | | | |
|---|---|---|---|---|
| 4,370,160 | A * | 1/1983 | Ziemelis | 504/323 |
| 6,476,905 | B1 * | 11/2002 | Li | 355/71 |
| 2002/0022124 | A1* | 2/2002 | Ruoff | 428/325 |
| 2003/0148379 | A1* | 8/2003 | Roitman et al. | 435/7.1 |
| 2004/0115279 | A1* | 6/2004 | Hansford et al. | 424/489 |
| 2004/0175843 | A1* | 9/2004 | Roitman et al. | 436/531 |

(Continued)

OTHER PUBLICATIONS

Xia et al., Soft Lithography, Annual review of Materials Science, 1998 28 p. 153-184.*

(Continued)

*Primary Examiner* — Duy Deo
*Assistant Examiner* — Erin Bergner
(74) *Attorney, Agent, or Firm* — Venable LLP; Henry J. Daley

(57) ABSTRACT

A method for producing particles includes providing a relief template having a surface relief pattern adapted to impart structure to a plurality of particles while they are under production; depositing a radiation-sensitive material on the relief template; exposing portions of the radiation-sensitive material on the relief template using a beam of spatially patterned radiation; removing portions of the radiation-sensitive material after the exposing to reveal at least portions of surfaces of the plurality of particles; and separating at least a portion of the plurality of particles from the relief template. At least a portion of a structure of each of the plurality of particles is defined by a combination of the surface relief pattern and the spatially patterned radiation.

25 Claims, 9 Drawing Sheets

(56) References Cited

U.S. PATENT DOCUMENTS

2010/0021985 A1     1/2010     Mason
2010/0035061 A1     2/2010     Mason et al.

OTHER PUBLICATIONS

Dictionary.com definition of separate pulled Aug. 25, 2014.*
Brown, A.B.D.; Smith, C.G.; Rennie, A.R. Fabricating colloidal particles with photolithography and their interactions at an air-water interface. Phys. Rev. E 2000, 62, 951-960.
Chou, S.Y. Nanoimprint lithography and lithographically induced self assembly. MRS Bulletin 2001, 26, 512.
Chou, S.Y.; Krauss, P.R.; Renstrom, P.J. Nanoimprint lithography. J. Vacuum Sci. Tech. B 1996, 14 (6), 4129-4133.
Hernandez, C.J.; Mason, T.G. Colloidal alphabet soup: Monodisperse dispersions of shape-designed LithoParticles. J. Phys. Chem. C 2007, 111, 4477-4480.
Hernandez, C.J.; Zhao, K.; Mason, T.G. Pillar-deposition particle templating: A high-throughput synthetic route for producing LithoParticles. Soft Materials 2007, 5, 1-11.
Hernandez, C.J.; Zhao, K.; Mason, T.G. Well-deposition particle templating: Rapid mass-production of LithoParticles without mechanical imprinting. Soft Materials 2007, 5, 13-31.
Higurashi, E.; Ukita, H.; Tanaka, H.; Ohguchi, O. Optically induced rotation of anisotropic micro-objects fabricated by surface micromachining. Appl. Phys. Lett. 1994, 64, 2209-2210.
Resnick, D.J.; Mancini, D.; Dauksher, W.J.; Nordquist, K.; Bailey, T.C.; Johnson, S.; Sreenivasan, S.V.; Ekerdt, J.G.; Willson, C.G. Improved step and flash imprint lithography templates for nanofabrication. Microelectronic Engineering 2003, 69, 412-419).
Rolland, J.P.; Maynor, B.W.; Euliss, L.E.; Exner, A.E.; Denison, G.M.; DeSimone, J.M. Direct fabrication of monodisperse shape-specific nanobiomaterials through imprinting. J. Am. Chem. Soc. 2005, 127, 10096-10100.
Sullivan, Matt; Zhao, Kun; Harrison, Christopher; Austin, Robert H.; Megens, Mischa; Hollingsworth, Andrew; Russl, William B.; Cheng, Zhengdong; Mason, Thomas; and Chaikin, P.M. "Control of colloids with gravity, temperature gradients, and electric fields", J. Phys.: Condens. Matter 15 (2003) S11-S18.

* cited by examiner

PROCESS FOR CREATING SHAPE-DESIGNED PARTICLES IN A FLUID

CROSS-REFERENCE TO RELATED APPLICATION

This application claims priority to U.S. Provisional Application No. 61/103,777 filed Oct. 8, 2008, the entire content of which is hereby incorporated by reference.

FEDERAL FUNDING

This invention was made using U.S. Government support under NSF CAREER Grant No. CHE-0450022. The U.S. Government has certain rights in this invention.

BACKGROUND

1. Field of Invention

This application relates to processes and systems for making particles, and more particularly processes and systems for making particles having a dimension less than about 1 mm and particles and compositions containing the particles.

2. Discussion of Related Art

The contents of all references, including articles, published patent applications and patents referred to anywhere in this specification are hereby incorporated by reference.

An important emerging class of non-spherical colloidal materials are microscopic and nanoscopic particles that have designed shapes and are created by lithographic means (see e.g. Hernandez, C. J.; Mason, T. G. Colloidal alphabet soup: Monodisperse dispersions of shape-designed LithoParticles. J. Phys. Chem. C 2007, 111, 4477-4480). (Shape-designed particles, regardless of the methods of production, will also be referred to as LithoParticles in this specification.) Optical pattern replicating systems, such as high-fidelity lens-based steppers (Madou, M. J. *Fundamentals of microfabrication: The science of miniaturization.* 2nd ed.; CRC Press: Boca Raton, 2002), typically used to print electronic structures on computer chips, have been used to mass-produce LithoParticles and create Brownian dispersions of an entire particulate alphabet: "Colloidal Alphabet Soup" (Hernandez, C. J.; Mason, T. G. Colloidal alphabet soup: Monodisperse dispersions of shape-designed LithoParticles. J. Phys. Chem. C 2007, 111, 4477-4480). In the basic implementation of this approach, a polymer resist layer can be cross-linked by the optical exposure and, after development, the polymer resist particles can be lifted off of the substrate (see U.S. application Ser. No. 12/377,773 filed Feb. 17, 2009 as a national stage application of PCT/US07/18365, entitled "Customized Lithographic Particles," by the same assignee as the current application, the entire contents of which are hereby incorporated by reference). This optical approach for making LithoParticles has important and non-obvious differences from earlier approaches (Higurashi, E.; Ukita, H.; Tanaka, H.; Ohguchi, O. Optically induced rotation of anisotropic microobjects fabricated by surface micromachining. Appl. Phys. Lett. 1994, 64, 2209-2210; Brown, A. B. D.; Smith, C. G.; Rennie, A. R. Fabricating colloidal particles with photolithography and their interactions at an air-water interface. Phys. Rev. E 2000, 62, 951-960; Sullivan, M.; Zhao, K.; Harrison, C.; Austin, R. H.; Megens, M.; Hollingsworth, A.; Russel, W. B.; Cheng, Z.; Mason, T. G.; Chaikin, P. M. Control of colloids with gravity, temperature gradients, and electric fields. J. Phys. Condens. Matter 2003, 15, S11-S18) that required destructive etching as part of the procedure.

Mechanical imprinting, whether thermal or step-and-flash, is a technology that involves bringing two solid surfaces into contact after depositing a desired material between them (Madou, M. J. *Fundamentals of microfabrication: The science of miniaturization.* 2nd ed.; CRC Press: Boca Raton, 2002; Chou, S. Y. Nanoimprint lithography and lithographically induced self assembly. MRS Bulletin 2001, 26, 512; Chou, S. Y.; Krauss, P. R.; Renstrom, P. J. Nanoimprint lithography. J. Vacuum Sci. Tech. B 1996, 14 (6), 4129-4133; Resnick, D. J.; Mancini, D.; Dauksher, W. J.; Nordquist, K.; Bailey, T. C.; Johnson, S.; Sreenivasan, S. V.; Ekerdt, J. G.; Willson, C. G. Improved step and flash imprint lithography templates for nanofabrication. Microelectronic Engineering 2003, 69, 412-419). Once the surfaces of the two plates touch, the material only fills trenches or wells in one plate that has been prepared with the desired relief patterns in the surfaces of the plates. Imprinting essentially forces a desired material into voids that have been created in one of the surfaces to form a mold. While the two plates are touching (or nearly touching), a process, such as cross-linking in the case of polymers, can be used to rigidify the material in the mold, and then the plates are separated. During the separation, if the release of the desired material from the corrugated surface can be made efficiently, then the result is a set of raised structures of the desired material on the flat surface of the other plate. Imprinting is a subset of the more general process of embossing, in which a mold is pressed into the surface of a material that is not as rigid and then removed to create raised corrugations that reflect the mold. However, by contrast to embossing, mechanical imprinting involves squeezing out material between two solid plates where they touch, so that only the negative relief corrugations in one plate become filled with the desired material.

Performing mechanical imprinting reproducibly in a production setting can be problematic for many reasons. It is often difficult to achieve good mechanical contact between the two plates over large surface areas. To mitigate this, large sections of the plates are often cut away so that only small, disconnected pedestals containing the desired patterns touch the flat plate. Using pedestals decreases the surface area and production rate significantly. Defects in the surfaces of the plates, dust, or enhanced surface roughness due to wear can preclude the exact contact of the plates, especially for larger substrate sizes. For very small shapes, the wetting properties of the material to be imprinted with the plates can play an important role in determining the success and reproducibility of the imprinting procedure. These are some of the primary reasons why mechanical imprinting has not been widely adopted by the electronics industry as a replacement to more reliable optical approaches. Although it is possible to create LithoParticles using imprinting methods, as we and others have demonstrated (see e.g. Rolland, J. P.; Maynor, B. W.; Euliss, L. E.; Exner, A. E.; Denison, G. M.; DeSimone, J. M. Direct fabrication of monodisperse shape-specific nanobiomaterials through imprinting (J. Am. Chem. Soc. 2005, 127, 10096-10100)), developing alternative approaches for rapidly mass-producing LithoParticles that do not involve mechanical imprinting would be highly useful.

One method of producing particles that does not involve mechanical imprinting is relief deposition templating. In this method, a patterned relief surface is created on a solid substrate, and a deposition of a particle material is made in a manner that creates discrete regions that can be separated from the template and retain a geometrical feature imparted by the template. Two implementations of this are pillar deposition templating (Hernandez, C. J.; Zhao, K.; Mason, T. G. Pillar-deposition particle templating: A high-throughput synthetic route for producing LithoParticles (Soft Materials 2007, 5, 1-11)) in which the particles are formed on the top surfaces of pillars (i.e. relief projections), and well deposition templating (Hernandez, C. J.; Zhao, K.; Mason, T. G. Well-deposition particle templating: Rapid mass-production of LithoParticles without mechanical imprinting (Soft Materials 2007, 5, 13-31)), in which the particles are formed by wells (i.e. relief depressions) in the template. The relief deposition templating method offers several advantages over mechanical imprinting, but it typically cannot be used if the deposited material forms an interconnected region over the relief structures that preclude facile separation of the particles from the template. Thus, it would be highly useful to further structure and pattern material deposited onto a patterned relief structure, including an interconnected layer of deposited material, on the template.

In addition, to more rapidly produce particles having more advanced complex three-dimensional shapes, it would be highly useful to combine the existing methods of radiation deposition templating (e.g., U.S. application Ser. No. 12/563, 907 assigned to the same assignee as the current application which is entitled "Mechanical Process for Creating Particles in a Fluid" filed on Sep. 21, 2009 as a CIP of PCT/US08/03679, the entire contents of which are incorporated herein by reference), which overcomes limitations of imprinting methods and which does not involve exposure to spatially patterned radiation (U.S. application Ser. No. 12/377,773), with the existing methods of spatially patterned radiation. The shape of the particle would then be designed by a combination of patterned surface relief and spatially patterned radiation. This combination would provide a versatility and efficiency for making shape-designed particles that can be superior to either of these methods on their own. Consequently, there remains a need for improved processes and systems for making particles having a dimension less than about 1 mm.

SUMMARY

A method for producing particles according to an embodiment of the current invention includes providing a relief template having a surface relief pattern adapted to impart structure to a plurality of particles while they are under production; depositing a radiation-sensitive material on the relief template; exposing portions of the radiation-sensitive material on the relief template using a beam of spatially patterned radiation; removing portions of the radiation-sensitive material after the exposing to reveal at least portions of surfaces of the plurality of particles; and separating at least a portion of the plurality of particles from the relief template. At least a portion of a structure of each of the plurality of particles is defined by a combination of the surface relief pattern and the spatially patterned radiation.

A multi-component composition according to some embodiments of the current invention includes a first material component in which particles can be dispersed, and a plurality of particles dispersed in the first material component. The plurality of particles is produced by methods according to embodiments of the current invention and the plurality of particles is at least 1,000 particles produced in a parallel process.

A system for manufacturing particles includes a relief template cleaning and preparation system; a deposition system arranged proximate the template cleaning and preparation system to be able to receive a relief template from the relief template cleaning and preparation system upon which a radiation sensitive material will be deposited to produce the particles; and an exposure system arranged proximate the deposition system to be able to receive a relief template from the deposition system through which the radiation sensitive material will be exposed to a beam of spatially patterned radiation to produce the particles; and a particle separating system arranged proximate the exposure system to be able to receive a relief template from the exposure system after radiation sensitive material has been deposited and exposed on the template. The relief template has a surface relief pattern structured to impart at least a portion of a structure to each of the plurality of particles, and the beam of spatially patterned radiation has been is constructed and arranged to impart at least a portion of a structure to each of the plurality of particles.

BRIEF DESCRIPTION OF THE DRAWINGS

The invention is better understood by reading the following detailed description with reference to the accompanying figures in which.

DETAILED DESCRIPTION

Figure 1:
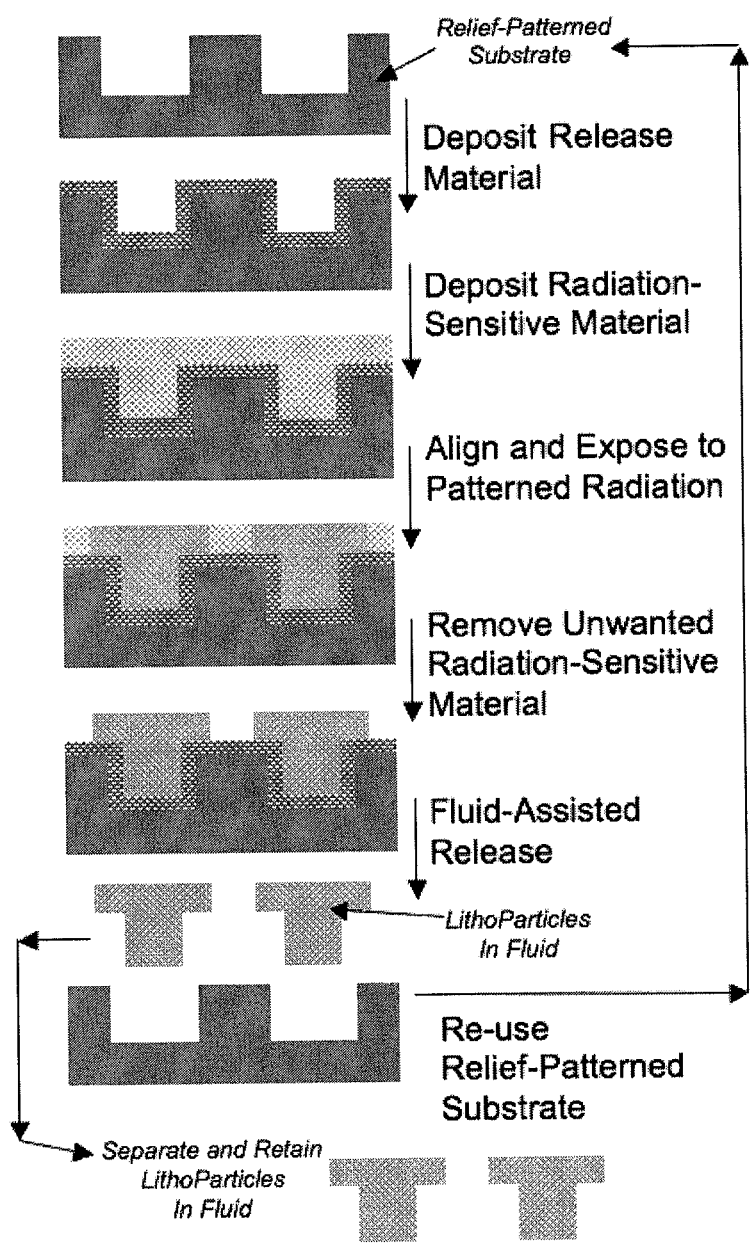
FIG. 1 is a schematic illustration of the process of relief radiation templating for making particles (i.e. LithoParticles) according to an embodiment of the current invention. A cross-sectional side view of the process is schematically shown. Starting with a template that has a patterned relief structure on a surface (top), a sacrificial release layer is deposited and retains at least some semblance of features of the patterned relief structure on the relief template, a radiation-sensitive target particle material is deposited, an exposure system for producing spatially patterned radiation is aligned relative to the relief structure on the template, spatially patterned radiation produced by the exposure system exposes the radiation-sensitive target particle material, the exposed radiation-sensitive target particle material is developed using a developer; and the particles are released by immersion and agitation in a fluid material, which causes the sacrificial layer to dissolve (bottom). The particles are retained in the fluid material, and the template is cleaned and re-used. The shapes of the particles reflect a combination of the relief structure imparted by geometrical features in the patterned relief structure on a surface of the template and also by geometrical features in the spatially patterned radiation.
Figure 2:
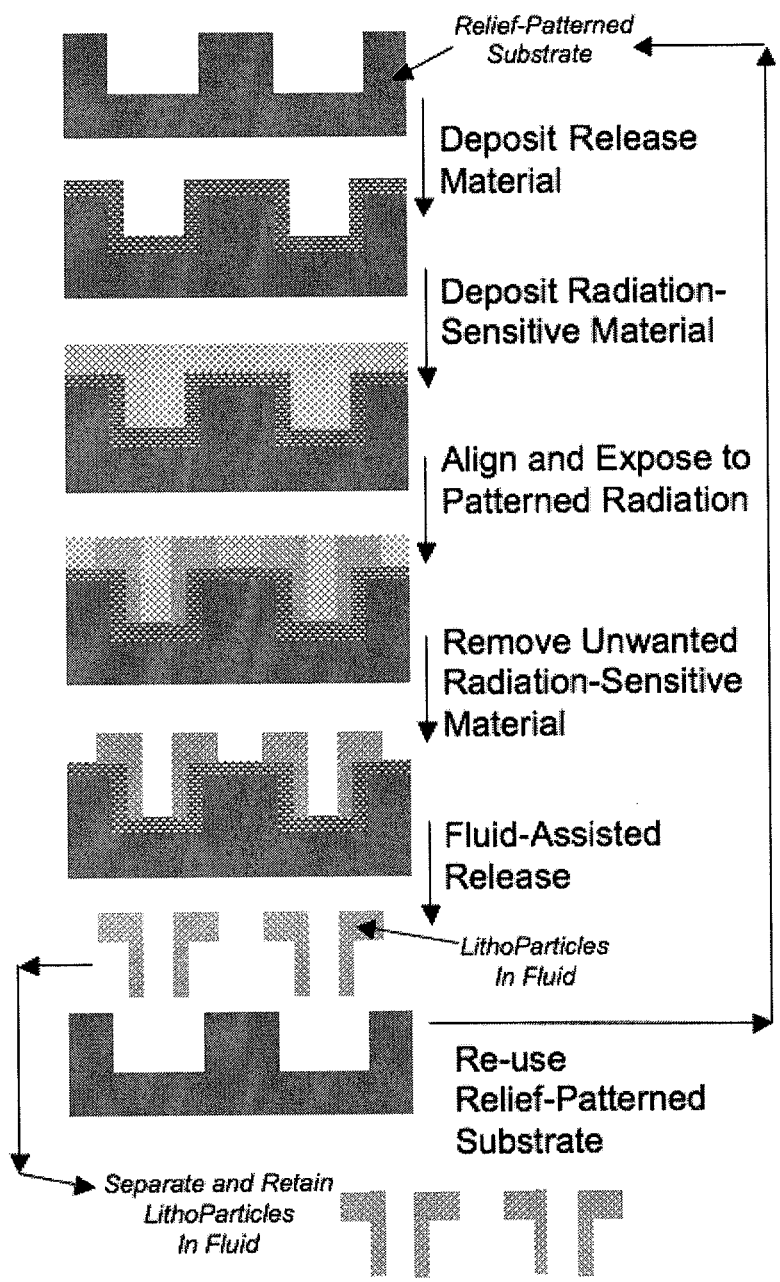
FIG. 2 is a schematic illustration of the process of relief radiation templating for making particles (i.e. LithoParticles) according to an embodiment of the current invention. A cross-sectional side view of the process is schematically shown. Starting with a template that has a patterned relief structure on a surface (top), a sacrificial release layer is deposited, a radiation-sensitive target particle material is deposited, an exposure system for producing spatially patterned radiation is aligned relative to the relief structure on the template, spatially patterned radiation produced by the exposure system exposes the radiation-sensitive target particle material, the exposed radiation-sensitive target particle material is developed using a developer; and the particles are released by immersion and agitation in a fluid material, which causes the sacrificial layer to dissolve (bottom). The particles are retained in the fluid material, and the template is cleaned and re-used. The shapes of the particles reflect a combination of the relief structure imparted by geometrical features in the patterned relief structure on a surface of the template and also by geometrical features in the spatially patterned radiation. Different shapes of particles can be produced using the same relief template simply by changing geometrical features in the spatially patterned radiation.
Figure 3:
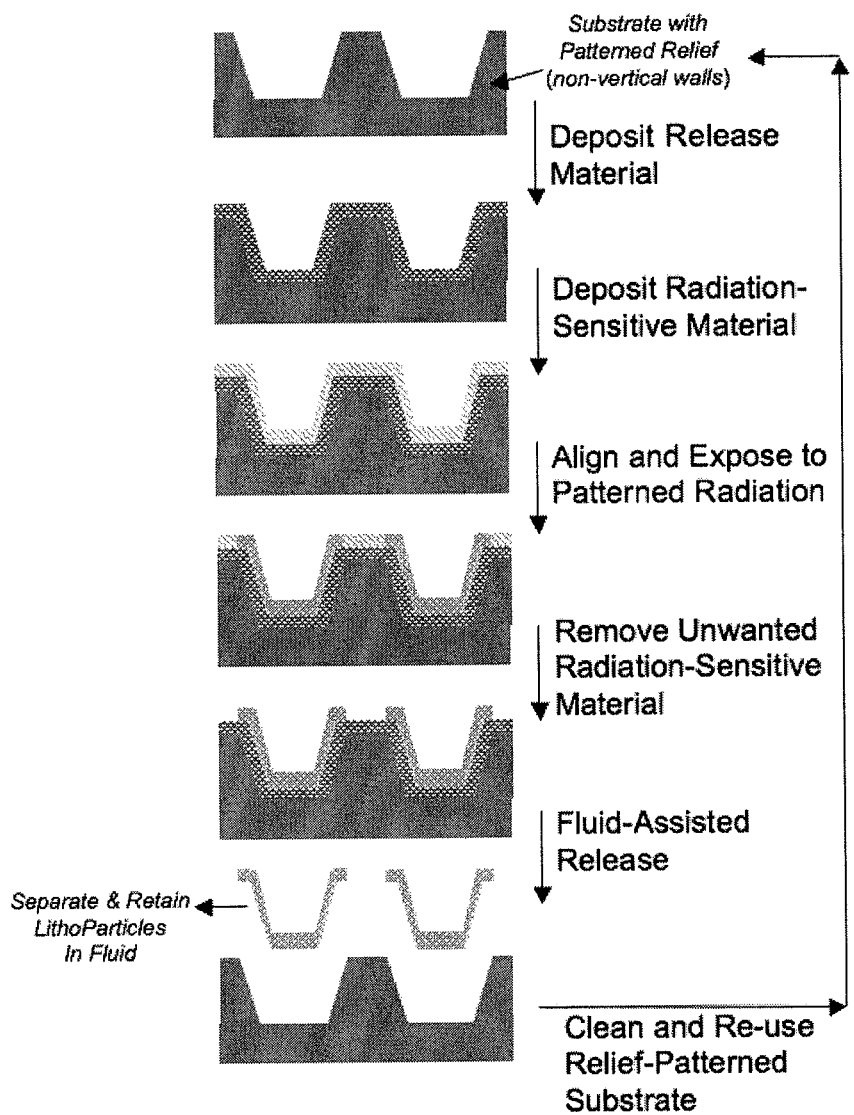
FIG. 3 is a schematic illustration of the process of relief radiation templating for making particles according to an embodiment of the current invention. A cross-sectional side view of the process is schematically shown. Uniform deposition of a radiation-sensitive target particle material on the surface of the relief-patterned substrate creates a layer of uniform thickness of the radiation-sensitive target particle material that reflects the contours and geometrical features of the substrate's surface. The thickness of this layer can be less than a maximum dimension reflecting the vertical surface roughness of patterned features in the surface of the relief template. The patterned radiation is aligned with the substrate so that radiation-sensitive material in certain desired relief regions is exposed, producing shapes of particles that reflect the relief structure as well as the structure of the patterned radiation. In the example shown, particles such as cups, displayed schematically in cross-section, are made using only a single exposure of spatially patterned radiation.
Figure 4:
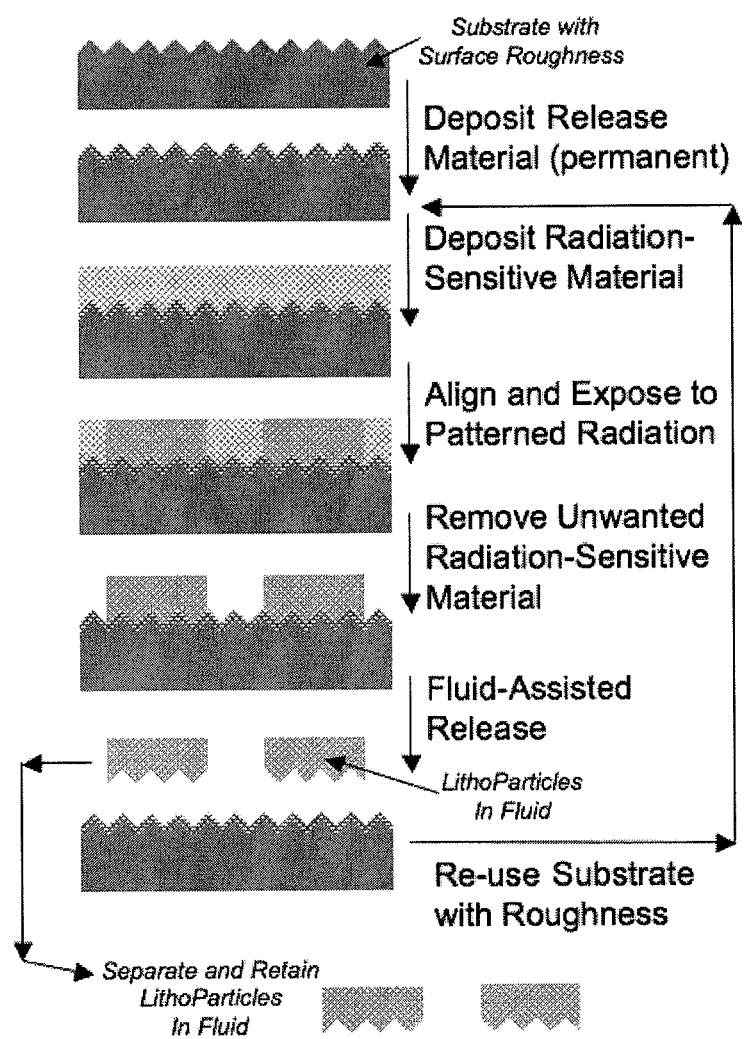
FIG. 4 is a schematic illustration of the process of relief radiation templating for making particles according to an embodiment of the current invention. A cross-sectional side view of the process is schematically shown. Uniform deposition of the radiation-sensitive target particle material on the top surface of the relief-patterned substrate creates a layer of uniform thickness of the radiation-sensitive target particle material. The thickness of this layer can be greater than a maximum dimension reflecting the vertical surface roughness in the top surface of the relief template. The top surface of the deposited radiation-sensitive target particle material can have a smaller dimension characterizing its surface roughness than the bottom surface of the deposited radiation-sensitive target particle material. The alignment of the patterned radiation with the relief structure on the template is optional. In the example shown, particles such as cups, displayed schematically in cross-section, are made using only a single exposure of spatially patterned radiation. The produced particles have a customized surface roughness on one side as well as a shape that contains features of the patterned radiation. In the example shown, a permanent release material is used to facilitate separation of the particles from the relief-patterned substrate.

In describing embodiments of the present invention illustrated in the drawings, specific terminology is employed for the sake of clarity. However, the invention is not intended to be limited to the specific terminology so selected. It is to be understood that each specific element includes all technical equivalents which operate in a similar manner to accomplish a similar purpose.

Some embodiments of the current invention provide methods for producing microscopic and/or submicroscopic particles. The methods according to some embodiments of the current invention include providing a template (i.e. relief template) that has a plurality of discrete surface portions, each discrete surface portion having a surface geometry selected to impart a desired geometrical property to a particle while being produced. Each of the discrete surface portions can be, but are not limited to, a flat surface, a curved surface, a complex contoured surface, a surface with a plurality of subsurface regions, or any combination thereof. Herein, microscopic refers to the range of length scales equal to and greater than one micrometer, including length scales ranging up to about one millimeter. Herein, submicroscopic refers to the range of length scales below one micrometer, including length scales ranging down to about one nanometer.

The methods according to some embodiments of the current invention also include depositing a constituent material of said at least one of microscopic and submicroscopic particles being produced onto said plurality of discrete surface portions of said template to form at least portions of said particles. The constituent material is a material in the composition of the particles being manufactured. The broad concepts of the current invention are not limited to any specific constituent materials. There is an extremely broad range of materials including organic, inorganic, composite, multi-component and any combination thereof that could be used in various embodiments of the current invention. The depositing can be a directional deposition in some embodiments of the current invention that, for example, leaves at least a fraction of wall portions around the discrete surface portions uncoated by the constituent material. The depositing can include spin-coating, spray-coating, dip-coating, sputtering, chemical vapor deposition, molecular beam epitaxy, electron-beam metal deposition, or any combination thereof in some embodiments of the current invention.

The methods according to some embodiments of the current invention further include separating at least one particle from the template in which the particle separated has the constituent material in its composition. The particle may be separated into a fluid, for example, into a liquid in some embodiments of the current invention. In some embodiments there may be one or a small number of particles separated from the template, but in other embodiments, there can be a very large number of particles separated in the same separation step. For example, in some embodiments there could be hundreds of thousands, millions and even billions or more particles separated from the template in the same step.

The methods according to some embodiments of the current invention further include processing the template for subsequent use in producing additional particles. Once the template is processed for subsequent use, the above-noted depositing and separating steps can be repeated to produce additional particles. The template may be reprocessed many times according to some embodiments of the invention to mass produce, in assembly-line fashion, very large numbers of the particles. The method of producing particles according to such embodiments of the current invention does not include pressing a structural component against the template to control the application of material to the template, such as is done with nanoimprinting and embossing methods.

Relief Radiation Templating (RRT)

An embodiment of the current invention provides a method of fabricating a plurality of microscopic or nanoscopic particles using an approach that we call Relief Radiation Templating (RRT). Particles produced using RRT have a shape, or even a plurality of shapes, that are dictated by a combination of geometrical features that have been designed into the surface topology of a relief template and geometrical features created by a spatially patterned exposure of a radiation-sensitive target particle material that has been deposited onto at least a portion of the template. After development of the radiation-sensitive material, this process typically creates a plurality of discrete islands of radiation-sensitive material in the form of particles on the surface of the template. The particles that are formed can have a maximum spatial dimension that is less than one millimeter. The particles that are formed also can possess microscale and nanoscale geometrical features, and these particles are typically released into a fluid material after exposure and development. In some embodiments of the current invention, the fluid material contains a stabilizing agent (e.g. surfactant or polymer) that inhibits aggregation or agglomeration of the particles after release.

In an embodiment of the current invention, a relief template is designed to define a portion of the shape or shapes of the desired particles. The relief template can be fabricated lithographically by patterning the surface of a solid substrate. In some embodiments, it is desirable to fabricate a relief template that contains an array of a same local structural corrugation that has a well-defined periodicity, typically along two orthogonal spatial dimensions parallel to the template's surface (although any set of basis vectors that can be used to cover a surface could define the center-to-center spacing between neighboring unit cells). This periodic corrugation can be obtained by standard methods of lithographic patterning and etching the surface of a solid substrate, such as the surface of a silicon wafer, according to some embodiments of the current invention. Optionally, in some embodiments of the current invention, in order to facilitate release of the particles later in the process, the relief template can be coated with either a temporary or permanent sacrificial release layer of material through a deposition process.

In some embodiments of the current invention, the solid patterned template is then coated over at least a portion of its surface with a radiation-sensitive material, such as a photoresist, that can be significantly altered and affected through a photochemical or photophysical process as a result of exposure to a sufficient energy of radiation having a prespecified wavelength. Examples of affecting a radiation-sensitive material include crosslinking a photoresist (e.g. SU-8 photoresist exposed to ultraviolet light) or degrading a polymeric material (e.g. poly-methylmethacrylate or PMMA exposed to an electron-beam). Thus, at least a portion of the surface of each complex-shaped solid object is thereby defined by the corrugations of the solid patterned template. The second type of spatial patterning is achieved through the alignment and exposure of the photosensitive material on the solid patterned template to radiation that has been spatially patterned, usually using a repeating pattern (e.g. spatial distribution of collimated radiation produced by a mask suitable for optical projection lithography performed by a stepper or step-and-repeat exposure system) that has a different local structure than the one used to create the solid patterned template according to some embodiments. In some embodiments of the current invention, the local features in the spatially patterned radiation have the same center-to-center periodicity as the local features as the solid patterned template. At least a portion of the surface of each complex-shaped particle is defined by the patterning of the radiation used to expose and affect the radiation-sensitive material.

In one embodiment of the RRT process, the corrugated surface of a relief template (RT) is coated with a uniform film of a light-sensitive photoresist (e.g. a polymeric material) that forms a crosslinked solid after exposure to at least enough energy of light at a certain wavelength. This spatially patterned light can have a wavelength in the ultraviolet or deep ultraviolet range suitable for triggering photochemical reactions in the photoresist, for example. To achieve the uniform coating, the template can be spray-coated, and this coating can be done while moving, rotating, or spinning the relief deposition template while directing a fine spray of the photoresist (e.g. polymer precursor molecules such as monomers or oligomers, photo-acid initiator/generator, and crosslinker molecules dissolved in a compatible solvent in suitable molar ratios) towards the corrugated surface of the relief template. Although spray coating can be used in many applications, other methods of deposition, such as chemical vapor deposition, physical vapor deposition, electron beam (i.e. e-beam) assisted metal vapor deposition, spin coating, and even electrodeposition could be used to make the coating. Organic, inorganic, metallic, semiconducting materials or a combination thereof can be used for the radiation-sensitive layer.

In some embodiments of the current invention, the relief template has a permanently etched pattern into the surface of a solid substrate. This pattern can be created on a polished, flat surface, such as a silicon wafer according to some embodiments. Alternatively, the relief template can be formed by a deposition and patterning process, such as growing or depositing a silicon dioxide layer on the surface of a silicon wafer and etching the silicon dioxide layer. In an embodiment of the current invention, the relief template is comprised of a thin flat wafer of solid material such as silicon or quartz, and the wafer can have a thickness ranging from several hundred micrometers up to one or more centimeters. The relief template is generally thick enough and solid enough to provide facile manipulation of at least one patterned surface for coating, exposure, development, and release steps and to prevent degradation of the patterned surface according to some embodiments of the current invention. Since some radiation sensitive materials can be deposited in the form of a liquid solution, it can be beneficial to heat or bake the coated template in order to drive off liquid solvent that may have been used during the coating deposition process, and thereby create a solid layer of radiation-sensitive material in some applications. Spin coating the template may be preferable to spray coating for certain embodiments to provide only a top coating of pillars that may be a portion of the relief template. The exposure of the coated relief template to spatially patterned radiation that has been aligned with respect to the relief template and subsequent development then results in a non-trivial combination of desired geometrical features encoded into the relief template and also desired geometrical features encoded into a beam or a plurality of beams of spatially patterned radiation.

The RRT approach for creating one or more particles is therefore significantly different than either the method of relief deposition templating which does not involve the exposure to spatially patterned radiation, and the method of spatially patterned radiation which does not rely upon a prescriptively designed substrate which has a patterned relief structure that imparts desired and complex shaped features to the particles that are produced. An advantage of RRT over both of these other approaches can be the complexity of the particle that can be produced. Compared to using either of these other two methods on their own, RRT can require a reduced number of lithographic steps to efficiently produce a plurality of particles having more complex shapes than a simple plate-like shape according to some embodiments of the current invention. By contrast, only for plate-like shapes, the method of relief deposition templating and the method of spatially patterned radiation typically offer an advantage of a reduced number of steps and cost for making plate-like or slab-like particles over RRT.

In several embodiments of the current invention, we illustrate the process for preparing many replicates of particles that all have the same shape. In other embodiments, with similar efficiency and shape-specificity, the RRT process can also be used to produce a plurality of particles that have many different structures using a single relief template and a single radiation mask to form the spatially patterned radiation.

A First Example Embodiment of the RRT Process

A process for mass-producing a plurality of particles using relief radiation templating according to an embodiment of the invention is as follows:

Phase I: Design and Fabricate a Relief Template and a Mask for Spatially Patterned Radiation Based on Desired Particle Shape.

A relief template can be created by standard lithographic techniques as described in Hernandez, C. J.; Zhao, K.; Mason, T. G. Pillar-deposition particle templating: A high-throughput synthetic route for producing LithoParticles (Soft Materials 2007, 5, 1-11) and Hernandez, C. J.; Zhao, K.; Mason, T. G. Well-deposition particle templating: Rapid mass-production of LithoParticles without mechanical imprinting (Soft Materials 2007, 5, 13-31). In one embodiment of the current invention, a relief template can essentially be a silicon wafer that has been patterned on its top surface using lithographic and etching processes. The pattern for the relief template, as well as the pattern for the radiation mask, can be readily designed using standard computer-aided design software, such as Tanner Research Inc.'s L-Edit software.

The design and production of the relief template can be accomplished through standard lithographic surface patterning methods using electron-beam lithography, x-ray lithography, deep-ultraviolet-light lithography, ultraviolet-light lithography, visible-light lithography, dip-pen lithography, and nano-imprint lithography, for example. In some embodiments, the structure of the relief template can resemble either a well deposition template, whereas in other embodiments, the structure of the relief template can resemble a pillar deposition template.

Likewise, the design and production of the radiation mask that is used to produce the spatially patterned radiation can be accomplished through standard lithographic surface patterning methods using electron-beam lithography, x-ray lithography, deep-ultraviolet-light lithography, ultraviolet-light lithography, visible-light lithography, dip-pen lithography, and/or nano-imprint lithography, for example. Standard procedures, such as electron beam lithography and direct write laser systems, for example, can be used to produce a mask suitable for creating spatially patterned radiation. For instance, L-Edit software can be used to design a photolithographic mask that contains features of the desired particles to be produced; this mask can be produced by a standard commercial mask-making facility (e.g. Digidat's photo-mask facility which uses MEBES electron-beam writers) for use in an ultraviolet lithography stepper system.

Once the relief template has been designed and fabricated, it can be used to produce particles repeatedly without being significantly degraded.

Phase II: Mass-Produce Particles Using a Combination of a Relief Template and Spatially Patterned Radiation.

The following steps can be employed to produce microscale and nanoscale particles using a relief template and a mask for spatially patterned radiation according to some embodiments of the current invention.

1. Deposit a layer of release material, which is soluble in a release fluid, on at least a portion of relief template (e.g. spray deposition of a thin layer of polymeric material in a solvent, such as Microchem's OmniCoat).

2. Prepare release material on coated relief template by performing physical preparation, chemical preparation, or a combination thereof (e.g. baking by raising the temperature to drive solvent from a layer of polymeric release material).
3. Deposit a radiation-sensitive material on at least a portion of release material, which had been previously deposited on relief template (e.g. spray deposition of a thin layer of photoresist material, such as SU-8-2001).
4. Prepare radiation-sensitive material on coated relief template by performing physical or chemical preparation (e.g. baking by raising the temperature to drive solvent from a layer of polymeric radiation-sensitive material).
5. Load the relief template (e.g. consisting of a wafer that has a smooth flat bottom and dimensions suitable for a vacuum chuck) in a lithographic exposure system suitable for producing radiation that can affect the radiation sensitive material (e.g. an Ultratech XLS i-line 5× reduction stepper).
6. Load the reticle that contains the mask pattern for forming spatially patterned radiation into the lithographic exposure system.
7. Command the lithographic exposure system to align the relief template relative to the mask pattern (e.g. using a micro-dark field alignment system; a small number of suitable reference marks may be needed on the relief template to facilitate alignment).
8. Expose at least a portion of the radiation-sensitive material on the relief template with sufficient radiation intensity over a sufficient duration (i.e. provide a sufficient total radiation energy per unit area) to affect said radiation-sensitive material (e.g. stepper exposes a portion of the surface of the relief template with spatially patterned radiation to initiate adequate photochemical crosslinking of the photoresist). If useful exposure settings for a radiation-sensitive material are not known in advance, they can be determined by a standard calibration procedure involving exposure over a range of intensities and durations and development over a range of accessible development conditions.
9. Repeat step 8 to expose other portions of the relief template as desired (e.g. generally the stepper only can expose a small portion of the relief template, so it is usually desirable to instruct the stepper to expose nearly the entire surface of the relief template through a sequence of step and flash operations).
10. Unload the relief template from the lithographic exposure system.
11. Perform a pre-development processing step (e.g. thermally bake according to the instructions for handling the photoresist).
12. Develop the radiation-sensitive material (e.g. using an organic-based solvent developer suitable for SU-8-2001 to remove the unexposed regions of SU-8 photoresist).
13. Lift-off and completely detach particles from the relief template (e.g. by immersing the release template in a release fluid containing stabilizing agents and agitating—such as Omnicoat developer in which sodium dodecyl sulfate SDS has been added).
14. Stabilize particles in release fluid against aggregation by providing a repulsive interaction between particles (e.g. permit or facilitate the stabilizing agents, such as amphiphilic molecules, in the release fluid to adsorb to or to bond to the surfaces of the particles of photoresist SU-8).
15. Separate particles from relief template (e.g. by removing relief template from release fluid).
16. Clean and re-use relief template (e.g. make a relief template suitable for starting again at step 1).

Several example embodiments of viable Phase II processes corresponding to the current invention are shown in FIG. 1, FIG. 2, FIG. 3, and FIG. 4.

Subsequent to the aforementioned Phase I and Phase II processes, any release material that may be present with the particles in the release fluid can be removed by dialysis, centrifugal fractionation, or other standard purification procedures.

Example Design of Relief Template and Mask to Produce a Desired Shape

Figure 5:
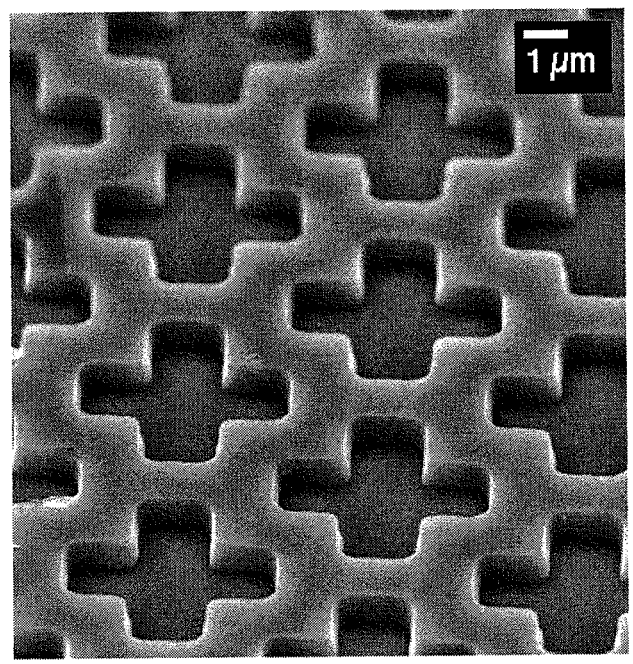
FIG. 5 is a scanning electron micrograph of a portion of a relief template suitable for making particles according to an embodiment of the current invention. The relief template, which is produced through a standard lithographic process for patterning and etching the top surface of a silicon wafer, contains a repeating array of cross-shaped wells on a flat surface of a silicon wafer. The repeating array of these wells follows a hexagonal pattern to increase the particle production per unit area of the relief template. The relief template may also have larger fiducial alignment marks at certain locations to facilitate alignment of the relief template with respect to an exposure system, which may contain a radiation mask, that is used to produce the spatially patterned radiation.
Figure 6:
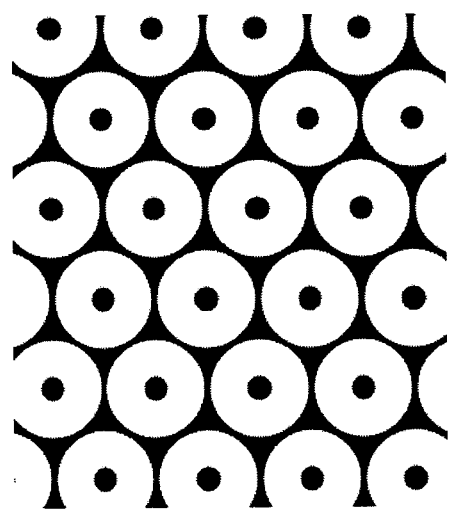
FIG. 6 is a schematic illustration of a portion of a radiation mask pattern suitable for making particles according to an embodiment of the current invention. The radiation mask pattern is suitable for creating an exposure of spatially patterned radiation in the form of an array of ring-like shapes (i.e. circular annuli) that can be used to produce the same center-to-center distances as the square crosses shown in FIG. 5. Lighter regions indicate where light can pass through the mask and darker regions prevent the light from passing through the mask.
Figure 7:
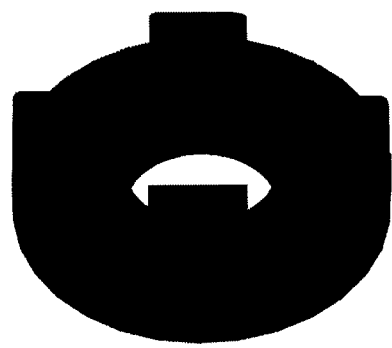
FIG. 7 is a schematic illustration of a portion of a particle formed by a combination of the surface relief pattern of a relief template and spatially patterned radiation according to an embodiment of the current invention. An orthographic 3-d view is schematic approximate representation of a particle in the form of a cross-shaped washer that can be created using a relief template as shown in FIG. 5 and spatially patterned radiation created by a radiation mask pattern in FIG. 6. As shown, the particle has been flipped over, compared to how it would reside on the relief template prior to release from the template (according to orientations shown in the production process illustrated in FIG. 2), to better reveal the spoke-like arms arising from the relief shapes of crosses on the relief template.

In an embodiment of the current invention, to provide a higher level of detail of the Phase I process for designing a relief template and a mask for patterning radiation, we discuss an example. Suppose that one wishes to make a plurality of uniform microscale or nanoscale particles that have disk-like shapes that are flat on their top surfaces, have four spoke-like arms on their bottom surfaces arranged in a simple cross, and have central holes that extend all the way through the particles. This could be accomplished in a number of different design approaches for the relief template and radiation mask using RRT. One of these designs is a relief template made of silicon that has been patterned with an array of cross shapes, as shown in FIG. 5. This relief template defines a portion of the particles shapes that correspond to the bottom surfaces. The radiation mask has been patterned to provide spatially patterned ultraviolet light in the form of annular disks that have center-to-center distances that are commensurate with the center-to-center distances of the relief template, as shown in FIG. 6. The outer radius of the annulus provides a beam of radiation that can be used to expose a photoresist material with a stepper over the same distance as the end-to-end distance between the arms on a cross. The radiation mask effectively defines the sidewalls of the particles, including the outer disk-like shapes and the central holes. The top surfaces are flat as a result of surface tension that causes the photoresist coating to assume a flat surface; this photoresist (e.g. SU-8) has been added in sufficient quantity and polymer concentration to fill the depressions in the relief template plus create a uniform layer over the entire surface of the relief template. After coating the relief template with the release material and radiation-sensitive material, for instance using a polymer photoresist in a liquid and after baking to remove the solvent, it is possible to align the coated relief template (e.g. a template which may contain fiducial marks to aid an alignment system such as a dark field alignment system) with the radiation mask and to expose the photoresist material using an automated photolithography system such as a stepper. After exposure and subsequent baking steps to ensure crosslinking of the exposed photoresist, development using a fluid developer is used to remove the unexposed photoresist material, leaving the desired particles as crosslinked SU-8 photoresist on the release material coating the relief template. By dissolving the release layer using a release fluid that contains amphiphilic molecules, such as an aqueous SDS solution near its critical micelle concentration, the particles are lifted-off of the relief template and stabilized against subsequent aggregation in the release fluid. The particles are separated from the relief template, the relief template is cleaned (e.g. using an appropriate acid bath), and the relief template can be subsequently re-used to produce more particles by repeating the Phase II process. A 3-dimensional representation of a complex shape that can be created through this process is shown in FIG. 7.

A Second Example Embodiment of the RRT Process

A simple alternative method for making the LithoParticles using RRT involves permanently bonding a low-surface energy release agent to the surfaces of the relief template. This release agent can take the form of a fluorocarbon, fluorohydrocarbon, or fluoro-siloxane with appropriate reactive groups for bonding these molecules to a portion of the surfaces of the relief template. This type of low-surface energy coating can be applied using standard methods of surface treatment. After treating the relief template by coating and bonding a high surface density of such molecules to all of the patterned surfaces, the treated relief template surface will have only a very weak attractive interaction with a desired particle material. The permanent release coating permits facile fluid-assisted release of particles from the patterned surfaces of the relief template without the need for the fluid material to dissolve a sacrificial release layer. For instance, in an example embodiment of RRT shown in FIG. 4, a permanent release layer is used. After exposure to spatially patterned radiation and development, fluid-assisted release involving agitation can dislodge the particles from the coated relief template without removal of a sacrificial release layer.

A Third Example Embodiment of the RRT Process

According to another embodiment of the current invention, a flat, polished silicon wafer, having a four-inch diameter and thickness of about 500 microns, is etched on one side to form a plurality of wells, each well has a shape of a square cross that is about 4.5 microns end-end length for the arms and each arm is about 1 micron wide. The depth of the wells is approximately one micron. The arrangement of the wells is in an array, where center-to-center positions of the crosses form a hexagonal lattice, as illustrated in FIG. 5. This patterned and etched wafer is the relief template (i.e. and is also referred to as the relief substrate).

A layer of release material is deposited onto the relief template. In this example, the release material is Omnicoat (from MicroChem Inc.), and, after it has been deposited as a thin solid layer, it can be dissolved in an aqueous solution that has a pH adjusted according to instructions of the manufacturer. The purpose of this layer is to provide a facile means of releasing additional material to be deposited from the relief template without degrading the relief template, as will be described in a subsequent step. Although depositing only one thin layer of release material may be adequate to provide subsequent release of particles through lift-off, in order to assure complete lift-off of all particle structures from the relief template in subsequent steps, we deposit three layers of liquid Omnicoat using a combination of spray deposition and spin coating onto the patterned surface of the relief template. As is standard in spin-coating, a thermal baking step according to manufacturer's specification is used to drive off any residual solvent, leaving a layer of solid Omnicoat of approximately 90 nanometer thickness that covers the patterned surfaces of the relief template, including the surfaces of the wells, but does not fill up the wells with release material. Thus, the relief patterns of a plurality of wells of square crosses that were etched in the silicon wafer are still substantially evident and can impart a geometrical feature to the radiation-sensitive particle material even after the relief template has been coated with the release material. In this example, the thickness of the layer of release material after this step is significantly less than the depth, width, and length of the relief features, such as the wells, on the patterned substrate.

Following the deposition of the release material onto the relief template, radiation-sensitive material is then deposited onto the release material using a combination of spray deposition and spin coating. In this example, the relief template is further coated with epoxy photoresist SU-8 (e.g. SU-8-2001 from MicroChem Inc.) onto the Omnicoat® deposit to form a layer of photoresist that is about one micron thick. A thermal baking step is used to drive off residual solvent from the SU-8. After this deposition of radiation-sensitive material, the SU-8 fills a plurality of wells that have been coated with a thin layer of Omnicoat release material on the relief template.

Following the deposition of the radiation-sensitive material onto the release-coated relief template, the prepared relief template is exposed with spatially patterned radiation. In this example, the spatially patterned radiation is produced using a Karl Suss MA6 mask aligner that has been loaded with a photo-mask that patterns mercury i-line ultraviolet light over the surface of the coated relief template. The particular photomask created for this example provides ultraviolet light in the form of a plurality of clear regions that resemble square frames in a square array. Hard contact exposure of the coated relief template using the mask aligner provides sufficient ultraviolet illumination to initiate cross-linking of the SU-8 photoresist only in the spatially patterned regions where the i-line light passes through the mask and onto the SU-8 coated relief template. In this example, the mask aligner is set at an illumination of 9 mJ/cm$^2$ and exposes the coated relief template for a duration of 17 seconds through the photomask. The hard contact photolithography is a standard lithographic exposure procedure that does not mechanically impart any features to the SU-8 either before or after the exposure, so this exposure method does not represent a form of imprinting or embossing. Following exposure, a baking step is used to further enhance the crosslinking of the SU-8 photoresist in the exposed regions; this is a common post-exposure thermal-treatment procedure for SU-8 photoresist. After exposure using the mask aligner, common precautions are taken to prevent unintentional exposure by ultraviolet radiation (e.g. the thermal-treatment baking step is performed in a yellow room that has lighting equipped with appropriate ultraviolet filters that block ultraviolet light).

Figure 8:
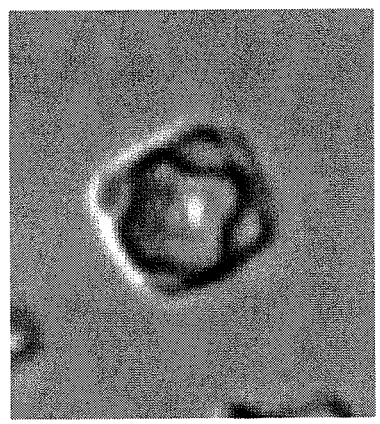
FIG. 8 is an optical micrograph showing an example of a discrete particle composed of SU-8 photoresist (upper right) that has been formed by a combination of the surface relief pattern of a relief template and spatially patterned ultraviolet radiation and released into a fluid material, an aqueous SDS solution (1 mM concentration), according to an embodiment of the current invention. The release material that has been used in the process is Omnicoat. The relief template that has been used is a hexagonal array of cross-shaped wells, as shown in FIG. 5. The spatially patterned radiation that has been used contains a square array of square frames (i.e. square donuts). A mask aligner was used in hard contact mode to expose SU-8 photoresist, the target particle material. The particle shown has a shape that contains geometrical features that reflect a combination of the square spatial patterning of the ultraviolet light as well as the hexagonal array of cross features that are imparted by the relief template. The edge length of the particle is approximately 5 microns and its maximum thickness is approximately 1 micron.

Following the exposure by spatially patterned radiation and thermal treatment of the radiation-sensitive material that had been deposited onto the relief template, the unexposed and uncrosslinked SU-8 photoresist is removed by treatment with a liquid solution of chemical SU-8 developer (from MicroChem Inc.). For our example, the relief template is placed patterned side-up in a pyrex crystallizing dish having about 6 inch diameter, a solution of SU-8 developer is added to fill the crystallizing dish to a depth of about 2 centimeters, and the dish is placed on an orbital shaker that agitates the liquid developer, causing it to flow over the coated surface of the relief template for about five minutes. This development process dissolves or otherwise removes the regions of SU-8 that were not exposed to spatially patterned ultraviolet radiation. After development and washing of residual developer away from the surface, the relief template that has a plurality of discrete solid SU-8 structures attached to the Omnicoat release material is obtained. An example of a particle produced is shown in FIG. 8. Each of these discrete solid SU-8 structures has a shape that contains at least a portion of a shape feature that is defined by a relief structure on the relief template (e.g. a cross) and also at least a portion of a shape feature that is defined by the spatially patterned radiation to which it was exposed (e.g. a square frame). Once development of the SU-8 photoresist has been completed, there is no need for the subsequent steps to be completed in a yellow room.

Following the development step, the discrete solid SU-8 structures are released from the relief radiation template by dissolving the Omnicoat using an aqueous liquid solution of Omnicoat developer (from MicroChem Inc.). Sodium docecyl sulfate (SDS) surfactant is added to the developer to obtain an SDS concentration of 1 mM; the SDS functions as a stabilizing agent. The relief template (that has been coated with Omnicoat and to which the discrete SU-8 structures are attached) is placed face-up in a 6-inch diameter pyrex crystallizing dish, an approximately 1 cm layer of liquid solution of Omnicoat developer+SDS is added into the dish, so the relief template is fully immersed, and the dish is placed on a device that can generate a liquid flow. Although an orbital shaker can produce adequate flows to cause release (and could be desirable if stronger flows could potentially break or damage the SU-8 structures), we immerse the dish in a Branson ultrasonic bath and turn on the ultrasonic excitation to speed up the dissolution of the Omnicoat. The SDS has been added to the solution in order to stabilize the SU-8 particles against aggregation and against agglomeration after they are released from the relief template into the liquid solution.

The desired material obtained from this example embodiment is a dispersion of particles of SU-8 that have a variety of shapes, each shape being at least partially defined by a portion of the physical structure of the relief template and also at least partially defined by a portion of the spatially patterned radiation.

Figure 9:
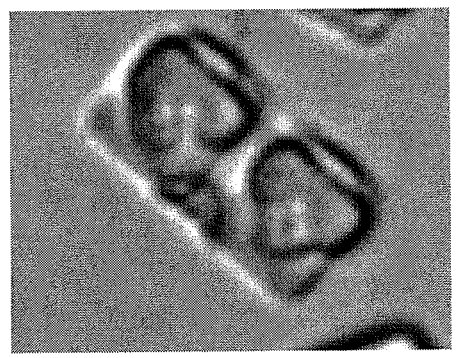
FIG. 9 is an optical micrograph showing another example of a discrete particle composed of SU-8 photoresist (upper right) that has been formed by a combination of the surface relief pattern of a relief template and spatially patterned ultraviolet radiation and released into a fluid material, an aqueous SDS solution (1 mM concentration), according to an embodiment of the current invention. The release material that has been used in the process is Omnicoat. The relief template that has been used is a hexagonal array of cross-shaped wells, as shown in FIG. 5. The spatially patterned radiation that has been used contains a square array of square frames (i.e. square donuts). A mask aligner was used in hard contact mode to expose SU-8 photoresist, the target particle material. In this case, a thin layer of SU-8 interconnects two square donut shaped regions that have been imparted by the spatially patterned radiation and that also have portions of cross features on one side that have been imparted by the relief template. The dimer particle shown has a shape that contains geometrical features that reflect a combination of the square spatial patterning of the ultraviolet light as well as the hexagonal array of cross features that are imparted by the relief template. The particle shown has dimensions of approximately 5 microns wide by 10 microns long by 1 micron thick.

In another embodiment of the current invention, the spatially patterned radiation can also be used to create interconnections between particle material deposited in adjacent wells, as shown for SU-8 dimer particle in FIG. 9.

It can be reasonably anticipated that using a lithographic projection exposure system, such as a lithographic stepper or a step-and-repeat system, would potentially provide higher throughput than hard contact exposure using a mask aligner. Because a stepper is a projection exposure system, the stepper does not require contacting a mask with the deposited radiation-sensitive target particle material. Instead, when exposing the relief template using a stepper, ultraviolet light passes through the photomask, and the resulting ultraviolet patterned radiation is directed by a lens onto the relief template, so the photomask remains far away from the relief template during the entire process of making particles. Using a stepper also offers the advantage of robotic automation in a production line as well as preserving the photomask in pristine condition so that it can make many exposures without having to be cleaned.

A Fourth Example Embodiment of the RRT Process

According to another embodiment of the invention, using techniques that are well known in the art of lithography, it can be reasonably anticipated that only a minor modification to the above steps is necessary to create a dispersion of uniform (i.e. monodisperse) particles of SU-8 having only a single desired and pre-designed shape. One way of achieving this is the following. To the process that has been described in the aforementioned third example embodiment, prior to exposure of the coated relief template to spatially patterned radiation, it is possible to add a step wherein the coated relief template is accurately aligned relative to the spatially patterned radiation. For instance, this could be accomplished using a microscopic dark field alignment system in combination with fiducial marks, or a micro/nano-positioner with a feedback loop in combination with fiducial marks. By achieving proper alignment of the relief template relative to the spatially patterned radiation, and by designing the arrays of relief features on the relief template to have the same relative positions between the centers of the local relief features as the positions between the centers of the local features in the array of the radiation mask used to create spatially patterned radiation, it is possible to create a plurality of local relief structures (e.g. wells each in the shape of a square cross) in combination with and properly aligned with a plurality of local exposure patterns of ultraviolet light (e.g. square frames) that are substantially the same over the entire surface of the relief template. If the maximum lateral spatial dimensions of the local relief features and exposure pattern are both less than several microns, this example embodiment can produce many millions or even billions of uniform SU-8 microscale particles or nanoscale particles from the surface of a single relief template that has a diameter of four inches.

Further Embodiments

Relief templates can be made by many different possible procedures. Standard lithography procedures, such as electron beam lithography and optical lithography, can be used in conjunction with etching, to make relief templates. However, other methods can be used, too. One method involves coating a wafer's surface with diblock polymers that form phases of dots or short stripes that can be etched onto the wafer's surface to provide either pillars or wells in the form of the dots or stripes. Another possible method is to coat the wafer's surface with a solution of polymer particles and use these particles as a mask during an etching process. This type of process could be used to make circular pillars or even ring-like pillars. If complex particle shapes, such as those made using lithographic methods, are deposited, relief templates for reproducing their shapes could potentially be made this way. Yet another method of making a relief template could be to cover a wafer's surface with a microporous or nanoporous membrane or film. This kind of relief template may not be comprised of only one material but may be made instead from two or more materials that have been put together to create the desired pillars and wells. Optionally, the exposed surface of a wafer could be selectively etched using an ion etcher in the regions where the holes appear and the membrane could then be removed from the surface.

Multiple deposition steps using different materials can be used in combination with relief templates in order to make complex particles that have layers of different kinds of materials, including organics, inorganics, metals, alloys, and biomaterials, some of which may be radiation sensitive and some of which may not. By combining sequences of deposition of different desired materials in controlled amounts with complex templates that have multiple levels in different shapes, it is possible to produce very complex particles that have differently shaped substructures of particularly desired materials located in pre-specified regions. In particular, selective spatially patterned deposition can be used in combination with relief templates to create local patches or particle substructures that can create desired and pre-specified interactions, whether attractive or repulsive, between different particles after their release into the fluid material. Alternatively, local regions on the surfaces of the particles can be made rough through a selective deposition process that coats only part of the particles' surfaces with a desired material in a manner that produces an enhanced surface roughness in a desired sub-region of the particle. Thus, by controlling the deposition as well as the template, it is possible to design particles that have customized localized surface coatings that can interact with local sites on the surfaces of other particles to form assemblies of particles that have either the same or different shapes.

Before a particle is separated from a relief template, it typically will be solid or will at least become partially solid so that it retains a geometrical feature of the surface portion of the template (or coated template) with which it was in contact and so that it also retains a geometrical feature imparted by the spatially patterned radiation, after the separation. The forming of a particle could involve depositing a liquid dispersion and then inducing a chemical reaction, thermal polymerization of a polymer component, photo-induced polymerization, plasma-induced polymerization, sintering, a crosslinking reaction, a gelation, an evaporation of the solvent, an aggregation or agglomeration of materials, a jamming, an entanglement, a denaturation, and/or a bonding.

In another embodiment of the current invention, the spatially patterned radiation consists of disconnected regions of patterned radiation that are separated from each other to form at least a portion of the outermost boundary surfaces of a plurality of particles.

The radiation-sensitive constituent particle material as first applied to the template can be a vapor, a liquid, or a solution, for example. The maximum dimension associated with any of the components contained within the constituent material should be smaller than the maximum dimension associated with the portion of the surface for creating the particles. For example, it is sometimes desirable to disperse nanoparticles in a radiation sensitive photoresist material prior to deposition of this material onto the relief template and exposure to a mask pattern containing features significantly larger than the nanoparticles. The resulting custom-shaped lithoparticles can then contain dispersed nanoparticles within them.

The relief template can be produced from a flat smooth substrate by a lithographic process involving at least one of electron-beam lithography, optical lithography, ultraviolet lithography, dip-pen lithography, x-ray lithography, imprinting, stamping, deposition, patterning, and etching, for example.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. It is intended, therefore, that the invention be defined by the scope of the claims that follow and that such claims be interpreted as broadly as is reasonable.

I claim:

1. A method for producing particles for assembling multi-particle structures, comprising:
   providing a relief template having a surface relief pattern adapted to impart structure to a plurality of particles while they are under production;
   depositing a radiation-sensitive material on said relief template;
   exposing portions of said radiation-sensitive material on said relief template using a beam of spatially patterned radiation;
   removing portions of said radiation-sensitive material after said exposing to reveal at least portions of surfaces of said plurality of particles; and
   separating at least a portion of said plurality of particles from said relief template,
   wherein at least a portion of a structure of each of said plurality of particles is defined by a combination of said surface relief pattern and said spatially patterned radiation,
   wherein said separating comprises contacting said plurality of particles with a fluid material to form a dispersion of said plurality of particles in said fluid material,
   wherein said fluid material comprises a stabilizing agent, and
   wherein said at least a portion of a structure of each of said plurality of particles is defined by a combination of said surface relief pattern and said spatially patterned radiation so as to allow for said plurality of particles to be assembled into compound structures.

2. A method of producing particles according to claim 1, further comprising aligning said beam of spatially patterned radiation relative to said surface relief pattern of said relief template, subsequent to said depositing and prior to said exposing.

3. A method of producing particles according to claim 1, further comprising depositing a release material onto said surface relief pattern of said relief template to facilitate said separating, subsequent to said providing said relief template and prior to said depositing said radiation sensitive material.

4. A method of producing particles according to claim 1, wherein said depositing is at least one of spin-coating, spray-coating, dip-coating, sputtering, vapor condensation, chemical vapor deposition, physical vapor deposition, laser ablation deposition, molecular beam epitaxy, electro-coating, and electron-beam metal evaporation.

5. A method of producing particles according to claim 1, wherein each of said plurality of particles has a maximum spatial dimension that is less than about one millimeter.

6. A method of producing particles according to claim 1, wherein said beam of spatially patterned radiation is at least one of a beam of spatially patterned electromagnetic radiation, a beam of spatially patterned visible radiation, a beam of spatially patterned infrared radiation, a beam of spatially patterned ultraviolet radiation, a beam of spatially patterned deep ultraviolet radiation, a beam of spatially patterned x-ray radiation, a beam of spatially patterned soft x-ray radiation, a beam of spatially patterned neutron radiation, a beam of spatially patterned electron radiation, and a beam of spatially patterned ion radiation.

7. A method of producing particles according to claim 1, further comprising providing a pre-specified radiation mask to pattern said beam of spatially patterned radiation, and wherein said pre-specified radiation mask pattern is designed to produce at least a first boundary of said patterned radiation that yields an exterior surface structure of a particle and a second boundary of said patterned radiation that yields an interior surface structure of a particle subsequent to said removing portions of said radiation-sensitive material.

8. A method of producing particles according to claim 1, wherein said fluid material is at least one of a liquid, a Newtonian liquid, a viscoelastic liquid, a thixotropic liquid, a lyotropic liquid crystal, a thermotropic liquid crystal, an organic liquid, an inorganic liquid, a hydrocarbon liquid, a fluorocarbon liquid, a solution, an aqueous solution, a polymer solution, a biopolymer solution, a surfactant solution, a solution containing a stabilizing agent that inhibit aggregation of said plurality of particles, a solution containing a surface treatment agent, a dispersion, a nanoparticle dispersion, an emulsion, a nanoemulsion, a supercritical fluid, and a gas.

9. A method of producing particles according to claim 1, wherein said depositing said radiation-sensitive material forms an interconnected layer of said radiation-sensitive material on said surface relief pattern of said relief template.

10. A method of producing particles according to claim 1, wherein said depositing said radiation-sensitive material forms separate regions of said radiation-sensitive material on said surface relief pattern of said relief template.

11. A method of producing particles according to claim 1, further comprising depositing a non-radiation sensitive material onto said surface relief pattern of said relief template prior to said depositing said radiation sensitive material, wherein said non-radiation sensitive material becomes at least a portion of said particles.

12. A method of producing particles according to claim 1, wherein said radiation sensitive material comprises at least one of a photoresist, an ultraviolet resist, a deep ultraviolet resist, an x-ray resist, an electron beam resist, a neutron resist, a degradable polymeric material, an organometallic material, an inorganic material, an organic material, a metallic material, a cross-linkable polymeric material, and a radiation-reactive material.

13. A method of producing particles according to claim 1, wherein said surface relief pattern of said relief template is substantially un-altered by said producing particles and is suitable for subsequent reuse in producing said particles.

14. A method of producing particles according to claim 1, further comprising combining said radiation-sensitive material prior to said depositing with at least one of drug molecules, nutrient molecules, biodegradable polymers, biodegradable biopolymers, moisturizing molecules, wax molecules, non-volatile molecules, polymeric materials, emulsions, nanoemulsions, surfactants, detergents, wetting agents, particles, atomic clusters, molecular clusters, organic particles, inorganic particles, metallic particles, nanoparticles, organic nanoparticles, inorganic nanoparticles, metallic nanoparticles, quantum dots, metal clusters, ferromagnetic particles, ferromagnetic nanoparticles, paramagnetic particles, paramagnetic nanoparticles, reactive molecules, radioactive isotopes, molecules containing radioactive isotopes, particles containing radioactive isotopes, nanoparticles containing radioactive isotopes, radiation-reactive molecules, derivatized molecules, fluorescent molecules, dye molecules, drug molecules, biomolecules, biologically active molecules, proteins, lipids, deoxyribonucleic acids, ribonucleic acids, single-stranded deoxyribonucleic acid oligomers, partially single-stranded deoxyribonucleic acid oligomers peptides, polypeptides, copolypeptides, and any combination thereof.

15. A method of producing particles according to claim 3, wherein said release material comprises at least one of an organic material, a polymeric material, an oligomeric material, a resin material, an inorganic material, a metallic material, a hydrocarbon material, a fluorocarbon material, a surface modifier, a sacrificial material, a dissolvable material, a sublimable material, and a thermally meltable material.

16. A method of producing particles according to claim 1, wherein said exposing comprises using at least one of a lens-based imaging system, a mask aligner, a photolithographic stepper, a step-and-repeat lithography system, an ultraviolet stepper, a deep ultraviolet stepper, a pattern generator, an electron beam writer, a laser beam writer, an x-ray beam writer, a neutron beam writer, and an ion beam writer.

17. A method of producing particles according to claim 1, wherein said separating comprises at least one of a mechanical agitation, a vibration, an acoustic agitation, an ultrasonic agitation, a temperature change, and a fluid flow to cause said particles to separate from said template.

18. A method of producing particles according to claim 1, further comprising modifying a surface of said particles with a surface-modifying material having a predetermined chemical property by at least one of functionalizing, adsorbing, and coating said particles with said surface-modifying material after said separating.

19. A method of producing particles according to claim 1, wherein at least 1,000 of said particles are separated from said relief template by said separating.

20. A method of producing particles according to claim 1, wherein said radiation sensitive material is at least one of an elastic solid, a viscoelastic liquid, a viscous liquid, a gel, a dispersion, a sol, and a polymeric solution.

21. A method of producing particles according to claim 1, wherein said removing yields a plurality of disconnected regions of said radiation-sensitive material to form said plurality of particles.

22. A method of producing particles according to claim 1, wherein said plurality of particles consist essentially of said radiation-sensitive material and wherein said radiation-sensitive material remains solid subsequent to said exposing and said removing portions of said radiation-sensitive material.

23. A method of producing particles according to claim 1, wherein a 3-dimensional structure on an external edge in at least one particle of said plurality of particles is defined by said combination of said surface relief pattern and said spatially patterned radiation.

24. A method for producing particles, comprising:
providing a relief template having a surface relief pattern adapted to impart structure to a plurality of particles while they are under production, wherein said surface relief pattern comprises patterned features characterized by a maximum dimension reflecting a vertical surface roughness of said surface relief pattern;
depositing a radiation-sensitive material on said relief template such that said radiation-sensitive material forms a layer having a thickness that is less than said maximum dimension reflecting said vertical surface roughness of said patterned features of said relief template and wherein an upper surface of said layer of said radiation-sensitive material that is not in contact with said relief template is shaped substantially by said surface relief pattern of said relief template;
aligning a beam of spatially patterned radiation relative to said surface relief pattern of said relief template;
exposing portions of said radiation-sensitive material on said relief template using said beam of spatially patterned radiation;
removing portions of said radiation-sensitive material after said exposing to reveal at least portions of surfaces of said plurality of particles; and
separating at least a portion of said plurality of particles from said relief template,
wherein said separating comprises contacting said plurality of particles with a fluid material to form a dispersion of said plurality of particles in said fluid material,
wherein said fluid material comprises a stabilizing agent,
and wherein said combination of said surface relief pattern and said spatially patterned radiation results in a concave structure in at least one particle of said plurality of particles.

25. A method of producing particles according to claim 24, wherein an internal structure in at least one particle of said plurality of particles is also defined by said combination of said surface relief pattern and said spatially patterned radiation.

* * * * *